United States Patent
Sakakima et al.

(10) Patent No.: US 6,608,738 B2
(45) Date of Patent: Aug. 19, 2003

(54) MAGNETORESISTANCE EFFECT DEVICE UTILIZING AN OXIDE FILM TO PRODUCE ANTIFERROMAGNETIC EXCHANGE-COUPLING BETWEEN FIRST AND SECOND MAGNETIC FILMS IN EITHER THE PINNED LAYER OR THE FREE LAYER OF THE DEVICE

(75) Inventors: Hiroshi Sakakima, Kyotanabe (JP); Yasuhiro Kawawake, Uji (JP); Yasunari Sugita, Kadoma (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 49 days.

(21) Appl. No.: 09/920,309

(22) Filed: Aug. 1, 2001

(65) Prior Publication Data

US 2002/0036877 A1 Mar. 28, 2002

(30) Foreign Application Priority Data

Aug. 4, 2000 (JP) ........................... 2000-237817
Oct. 10, 2000 (JP) ........................... 2000-309895

(51) Int. Cl.$^7$ ............................................. G11B 5/39
(52) U.S. Cl. .............................. 360/324.11; 360/324.12; 365/173
(58) Field of Search ........................ 360/324.1–324.2; 365/171–173

(56) References Cited

U.S. PATENT DOCUMENTS 4,103,315 A * 7/1978 Hempstead et al. ........ 360/324
5,701,223 A   12/1997 Fontama, Jr. et al.

FOREIGN PATENT DOCUMENTS

| JP | 11-86235     | 3/1999  |
| JP | 2001-345493  | 12/2001 |
| WO | 99/14760     | 3/1999  |

OTHER PUBLICATIONS

European Search Report regarding Application No. 01117737.5 dated Nov. 26, 2002.

* cited by examiner

Primary Examiner—A. J. Heinz
(74) Attorney, Agent, or Firm—Renner, Otto, Boisselle & Sklar

(57) ABSTRACT

A magnetoresistance effect device includes: a free layer whose magnetization direction is easily rotated by an external magnetic field; a non-magnetization layer; and a pinned layer whose magnetization direction is not easily rotated by an external magnetic field, the pinned layer being provided on a face of the non-magnetization layer which is opposite to a face on which the free layer is formed, wherein the pinned layer includes: a first non-magnetic film for exchange-coupling; and first and second magnetic films which are antiferromagnetically exchange-coupled to each other via the first non-magnetic film, and the first non-magnetic film includes one of the oxides of Ru, Ir, Rh, and Re.

28 Claims, 7 Drawing Sheets

(Two arrows represent magnetization directions of magnetic films 303 & 304)

MAGNETORESISTANCE EFFECT DEVICE UTILIZING AN OXIDE FILM TO PRODUCE ANTIFERROMAGNETIC EXCHANGE-COUPLING BETWEEN FIRST AND SECOND MAGNETIC FILMS IN EITHER THE PINNED LAYER OR THE FREE LAYER OF THE DEVICE

BACKGROUND OF THE INVENTION

1. Field of the Invention

The present invention relates to a thermally-stable magnetoresistance effect device, and to a magnetic head, a magnetic recording apparatus, and a magnetoresistance effect memory device using the thermally-stable magnetoresistance effect device.

2. Description of the Related Art

In recent years, in a magnetoresistance effect device including a layered structure of ferromagnetic layer (free layer)/non-magnetic layer/ferromagnetic layer (pinned layer), studies on GMR (giant magnetoresistance) devices which use a metal film, such as Cu or the like, in the non-magnetic layer, and studies on a tunneling-type magnetoresistance effect device, called a TMR device, which uses an insulative film, such as $Al_2O_3$ or the like, in the non-magnetic layer, have become enthusiastic (Journal of Magnetism and Magnetic Materials, 139 (1995), L231). Application of the GMR device and the TMR device to a magnetic head and a memory device has been studied (2000 IEEE ISSCC TA7.2, TA7.3). There is already an application of the GMR device to a magnetic head. The TMR device exhibits a magnetoresistance change rate of about 40% at room temperature and is expected to achieve high output.

However, such a magnetoresistance effect device is a layered film having a thickness of several nanometers. At 250° C.–300° C. or higher, interfacial diffusion is caused in the magnetoresistance effect device, and characteristics of the magnetoresistance effect device deteriorate. Specifically, in a magnetoresistance effect device including an antiferromagnetic layer in which a pinned layer contains Mn, such as FeMn, IrMn, etc., and ferromagnetic layers which are exchange-coupled via the antiferromagnetic layer, at a temperature of 250° C. or higher, Mn is diffused, and as a result, characteristics of the magnetoresistance effect device deteriorate.

In order to eliminate such a problem, there is an attempt to form a pinned layer so as to have a structure, ferromagnetic layers/non-magnetic layer for exchange-coupling/ferromagnetic layers, wherein the two ferromagnetic layers are antiferromagnetically exchange-coupled via the non-magnetic layer for exchange-coupling containing Ru, Ir, Rh, etc. In such a structure, diffusion of Mn is prevented by Ru, Ir, Rh, etc.

However, in this case, the thickness of the non-magnetic layer for exchange-coupling is about 0.6–0.8 nm, and thus, at 300° C. or higher, diffusion is caused in an interface of the non-magnetic layer for exchange-coupling, whereby characteristics of such a magnetoresistance effect device deteriorate. That is, the above problem cannot be eliminated.

SUMMARY OF THE INVENTION

According to one aspect of the present invention, a magnetoresistance effect device includes: a free layer whose magnetization direction is easily rotated by an external magnetic field; a non-magnetization layer; and a pinned layer whose magnetization direction is not easily rotated by an external magnetic field, the pinned layer being provided on a face of the non-magnetization layer which is opposite to a face on which the free layer is formed, wherein the pinned layer includes: a first non-magnetic film for exchange-coupling; and first and second magnetic films which are antiferromagnetically exchange-coupled to each other via the first non-magnetic film, and the first non-magnetic film includes one of the oxides of Ru, Ir, Rh, and Re.

In one embodiment of the present invention, the magnetoresistance effect device is a tunneling-type magnetoresistance effect device.

In another embodiment of the present invention, the magnetoresistance effect device further includes an antiferromagnetic film which is magnetically exchange-coupled to the pinned layer.

In still another embodiment of the present invention, the free layer includes a second non-magnetic layer for exchange-coupling, and third and fourth magnetic films which are antiferromagnetically exchange-coupled to each other via the second non-magnetic film; the second non-magnetic film for exchange-coupling includes one of the oxides of Ru, Ir, Rh, and Re; and the third magnetic film has an intensity of magnetization M1 and a thickness t1 and the fourth magnetic film has an intensity of magnetization M2 and a thickness t2, and a product (M1×t1) is substantially different from a product (M2×t2).

In still another embodiment of the present invention, at least one of the first through fourth magnetic films mainly contains cobalt (Co) and also contains boron (B).

In still another embodiment of the present invention, at least one of the first and second magnetic films mainly contains cobalt (Co) and also contains boron (B).

In still another embodiment of the present invention, the magnetoresistance effect device further includes: an antiferromagnetic layer which is magnetically exchange-coupled to the pinned layer; and an underlying layer mainly containing NiFeCr, the underlying layer being provided on a face of the antiferromagnetic layer which is opposite to a face on which the pinned layer is formed.

According to another aspect of the present invention, a magnetoresistance effect device includes: a free layer whose magnetization direction is easily rotated by an external magnetic field; a non-magnetization layer; and a pinned layer whose magnetization direction is not easily rotated by an external magnetic field, the pinned layer being provided on a face of the non-magnetization layer which is opposite to a face on which the free layer is formed, wherein the free layer includes: a first non-magnetic layer for exchange-coupling; and first and second magnetic films which are antiferromagnetically exchange-coupled to each other via the first non-magnetic film, the first non-magnetic film includes one of the oxides of Ru, Ir, Rh, and Re, and the first magnetic film has an intensity of magnetization M1 and a thickness t1 and the second magnetic film has an intensity of magnetization M2 and a thickness t2, and a product (M1×t1) is substantially different from a product (M2×t2).

In one embodiment of the present invention, the magnetoresistance effect device is a tunneling-type magnetoresistance effect device.

In another embodiment of the present invention, the magnetoresistance effect device further includes: an antiferromagnetic layer which is magnetically exchange-coupled to the pinned layer; and an underlying layer mainly containing NiFeCr, the underlying layer being provided on a face of the antiferromagnetic layer which is opposite to a face on which the pinned layer is formed.

According to still another aspect of the present invention, a magnetic head for detecting a signal magnetic field from a recording medium includes: two shield sections each including a magnetic substance; and the magnetoresistance effect device of the present invention provided in a gap between the two shield sections.

According to still another aspect of the present invention, a magnetic head includes: a magnetic flux guiding section including a magnetic substance; and the magnetoresistance effect device of the present invention for detecting a signal magnetic field introduced by the magnetic flux guiding section.

According to still another aspect of the present invention, a magnetic recording medium includes: the magnetic head of the present invention for recording a signal in a recording medium; an arm on which the magnetic head is mounted; a driving section for driving the arm; and a signal processing section for processing the signal and supplying the processed signal to the magnetic head.

According to still another aspect of the present invention, a magnetoresistance effect memory device includes: a magnetoresistance effect device including a free layer whose magnetization direction is easily rotated by an external magnetic field, a non-magnetization layer, and a pinned layer whose magnetization direction is not easily rotated by an external magnetic field, the pinned layer being provided on a face of the non-magnetization layer which is opposite to a face on which the free layer is formed, wherein the pinned layer includes: a non-magnetic film for exchange-coupling; and first and second magnetic films which are antiferromagnetically exchange-coupled to each other via the non-magnetic film, the non-magnetic film for exchange-coupling includes one of the oxides of Ru, Ir, Rh, and Re; a word line for generating a magnetic field so as to invert the magnetization direction of the free layer; and a sense line for detecting a change in resistance of the magnetoresistance effect device.

In one embodiment of the present invention, the magnetoresistance effect device further includes an antiferromagnetic film which is magnetically exchange-coupled to the pinned layer.

In another embodiment of the present invention, the free layer includes: a second non-magnetic layer for exchange-coupling; and third and fourth magnetic films which are antiferromagnetically exchange-coupled to each other via the second non-magnetic film; the second non-magnetic film for exchange-coupling includes one of the oxides of Ru, Ir, Rh, and Re; and the third magnetic film has an intensity of magnetization M1 and a thickness t1 and the fourth magnetic film has an intensity of magnetization M2 and a thickness t2, and a product (M1×t1) is substantially different from a product (M2×t2).

In still another embodiment of the present invention, at least one of the first through fourth magnetic films mainly contains cobalt (Co) and also contains boron (B).

In still another embodiment of the present invention, at least one of the first and second magnetic films mainly contains cobalt (Co) and also contains boron (B).

In still another embodiment of the present invention, wherein the magnetoresistance effect device further includes: an antiferromagnetic layer which is magnetically exchange-coupled to the pinned layer; and an underlying layer mainly containing NiFeCr, the underlying layer being provided on a face of the antiferromagnetic layer which is opposite to a face on which the pinned layer is formed.

According to still another aspect of the present invention, a magnetoresistance effect memory device includes: a magnetoresistance effect device including a free layer whose magnetization direction is easily rotated by an external magnetic field, a non-magnetization layer, and a pinned layer whose magnetization direction is not easily rotated by an external magnetic field, the pinned layer being provided on a face of the non-magnetization layer which is opposite to a face on which the free layer is formed, wherein the free layer includes: a first non-magnetic layer for exchange-coupling; and first and second magnetic films which are antiferromagnetically exchange-coupled to each other via the first non-magnetic film, the first non-magnetic film includes one of the oxides of Ru, Ir, Rh, and Re, and the first magnetic film has an intensity of magnetization M1 and a thickness t1 and the second magnetic film has an intensity of magnetization M2 and a thickness t2, and a product (M1×t1) is substantially different from a product (M2×t2); a word line for generating a magnetic field so as to invert the magnetization direction of the free layer; and a sense line for detecting a change in resistance of the magnetoresistance effect device.

In one embodiment of the present invention, the magnetoresistance effect device further includes: an antiferromagnetic layer which is magnetically exchange-coupled to the pinned layer; and an underlying layer mainly containing NiFeCr, the underlying layer being provided on a face of the antiferromagnetic layer which is opposite to a face on which the pinned layer is formed.

According to still another aspect of the present invention, a memory device which is formed by the magnetoresistance effect devices of the present invention arranged in a matrix.

In one embodiment of the present invention, each of the magnetoresistance effect devices further includes: an antiferromagnetic layer which is magnetically exchange-coupled to the pinned layer; and an underlying layer mainly containing NiFeCr, the underlying layer being provided on a face of the antiferromagnetic layer which is opposite to a face on which the pinned layer is formed.

According to a magnetoresistance effect device of the present invention, an oxide film of Ru, Ir, Rh, or Re is used in a non-magnetic layer for exchange-coupling. In such a structure, diffusion of Ru, Ir, Rh, or Re at an interface of the non-magnetic layer for exchange-coupling is suppressed, and as a result, a heat-resisting property of the device is significantly improved. A hard-magnetic film may be used as a pinned layer in the magnetoresistance effect device. However, in such a case, when the size of the device is small, a magnetic field of the pinned layer influences a free layer. Thus, it is desirable that the pinned layer be formed of a layered antiferromagnetic coupling film which is magnetically exchange-coupled to an antiferromagnetic film.

In the layered antiferromagnetic coupling film where a first magnetic layer has the intensity of magnetization M1 and thickness t1 and a second magnetic layer has the intensity of magnetization M2 and thickness t2, the first and second magnetic films must be formed such that a product (M1×t1) is different from a product (M2×t2) in order to rotate the magnetization direction of the free layer to the direction of externally-applied magnetic field. This is because, in the case where (M1×t1)=(M2×t2), even if a magnetic field is applied, the magnetization direction of the free layer is inhibited from rotating to the direction of the applied magnetic field. It is desirable that the pinned layer be formed of the above layered antiferromagnetic coupling film which is magnetically exchange-coupled to an antiferromagnetic film.

A magnetic film which mainly contains cobalt (Co) and contains boron (B) may be used in a portion of a magnetic film(s) of the pinned layer or free layer, or both of the pinned layer and free layer of the magnetoresistance effect device of the present invention. With such a structure, a soft-magnetic characteristic of the free layer is improved, and as a result, a device with improved sensitivity can be obtained.

The above magnetoresistance effect device is provided in a gap between two shields which are made of a magnetic material, whereby a magnetic head which includes a thermally-stable reproduction head for detecting a signal magnetic field can be obtained.

According to the present invention, a magnetic head including a thermally-stable reproduction head which has a magnetic flux guide (yoke) section made of a magnetic material and which uses the above magnetoresistance effect device for detecting a signal magnetic field introduced along the magnetic flux guide section can be obtained.

A magnetic recording apparatus with superior thermal stability can be formed by the above magnetic head, a driving section for the magnetic head, a magnetic recording medium section for recording information, and a signal processing section.

A magnetoresistance effect memory device with superior thermal stability can be formed by the above magnetoresistance effect device, a conductive line (word line) for generating a magnetic field which inverts a magnetic field of the free layer in the magnetoresistance effect device, and a conductive line (sense line) for detecting a change in resistance of the magnetoresistance effect device.

Furthermore, the above memory devices are arranged into a matrix, and a driving circuit is provided thereto, whereby a (random access) memory device with superior thermal stability can be obtained.

Thus, the invention described herein makes possible the advantages of (1) providing a magnetoresistance effect device with improved thermal stability which exhibits stable characteristics even at 400° C.; and (2) providing a magnetic head, a magnetic recording apparatus, and a memory device using such a magnetoresistance effect device.

These and other advantages of the present invention will become apparent to those skilled in the art upon reading and understanding the following detailed description with reference to the accompanying figures.

DESCRIPTION OF THE PREFERRED EMBODIMENTS

Figure 1:
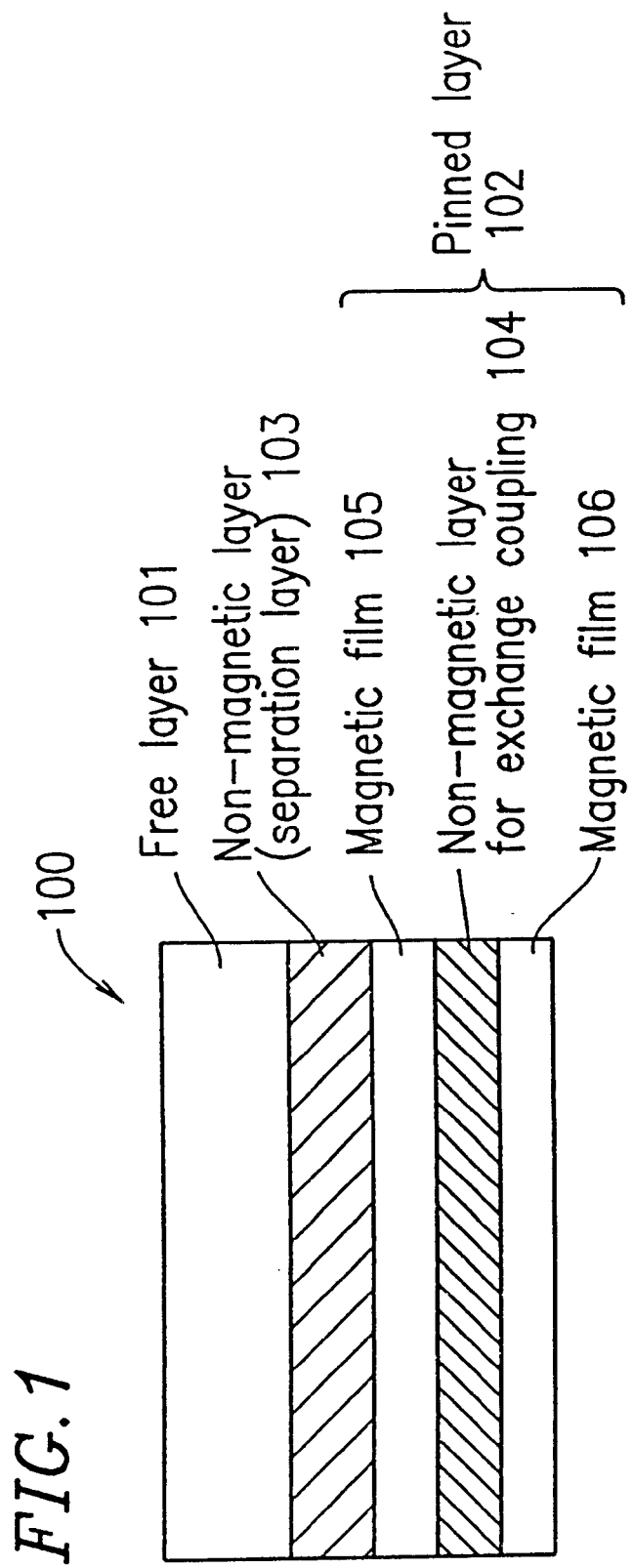
FIGS. 1 through 3 show examples of a magnetoresistance effect device according to the present invention.

FIG. 1 shows an example of a magnetoresistance effect device according to the present invention. The magnetoresistance effect device 100 includes a free layer 101 whose magnetization direction is easily rotated by an external magnetic field; a pinned layer 102 whose magnetization direction is not easily rotated by an external magnetic field; and a non-magnetic layer 103 interposed therebetween. The pinned layer 102 includes a non-magnetic layer 104 for exchange-coupling, and magnetic films 105 and 106 which are antiferromagnetically exchange-coupled to each other via the non-magnetic layer 104. The non-magnetic layer 104 for exchange-coupling contains oxides of any of Ru, Ir, Rh, and Re.

The free layer 101 and the pinned layer 102 are magnetically separated from each other by the non-magnetic layer 103. The magnetization direction of the free layer 101 freely rotates in response to an externally applied magnetic field, whereas the magnetization direction of the pinned layer 102 does not easily rotate in response to the externally applied magnetic field.

As described above, the pinned layer 102 includes the magnetic films 105 and 106 which are antiferromagnetically exchange-coupled to each other via the non-magnetic layer 104. A feature of the present invention is to use any of oxide films of Ru, Ir, Rh, and Re for the non-magnetic layer 104 which realizes an antiferromagnetic exchange-coupling.

Various metals, such as Cu, Ag, Cr, Ru, Ir, etc., are known as materials used in a non-magnetic film which antiferromagnetically exchange-couples two magnetic layers. However, a non-magnetic film which is formed of an oxide film or nitride film of the above metals and which achieves an antiferromagnetic exchange-coupling was not known. According to the common knowledge among those skilled in this art, a metal oxide film has no capacity to antiferromagnetically exchange-couple two magnetic layers. That is, it was unreasonable for those skilled in the art to use a metal oxide film as a non-magnetic film which achieves an antiferromagnetic exchange-coupling of two magnetic layers.

For example, an oxide film of Cu, Ag, Cr, or the like, cannot achieve an antiferromagnetic exchange-coupling of two magnetic layers. The reasons therefor are described below.

Electrons in the two magnetic films are referred to as "d-electrons". The d-electrons exhibit a localized behavior. Thus, when the two magnetic films are separated by several atomic layers, a magnetic interaction between the two magnetic films is abruptly weakened. Electrons in a non-magnetic metal film of Cu, Ag, Cr, Ru, Ir, or the like, are referred to as "s-electrons". When a non-magnetic metal film of Cu, Ag, Cr, Ru, Ir, or the like, is inserted between the two magnetic films, the s-electrons exhibit an itinerant behavior. The magnetic interaction of the d-electrons between the two magnetic films is strengthened by the intervening s-electrons which exhibit an itinerant behavior. As a result, the two magnetic films are antiferromagnetically or ferromagnetically exchange-coupled according to the distance between the two magnetic films (i.e., thickness of the non-magnetic metal film). This effect is known as "RKKY interaction".

However, when using an oxide film as the non-magnetic metal film, electrons in the oxide film do not exhibit an itinerant behavior but a localized behavior. Thus, it is difficult to antiferromagnetically exchange-couple the two magnetic films.

Thus, it is unreasonable for those skilled in the art to use an oxide film as a non-magnetic film for exchange-coupling.

Actually, an oxide film was not used as a non-magnetic film for exchange-coupling. It is known that even when a typical oxide film, such as $Al_2O_3$, $SiO_2$, or the like, is used between two magnetic films as a non-magnetic film for exchange-coupling, the two magnetic films are not exchange-coupled at all. This is said of oxide films of Cu and Cr. That is, an antiferromagnetic exchange-coupling of two magnetic films can be achieved via Cu or Cr, but cannot be achieved via an oxide layer of Cu or Cr.

The present inventors have reported that when a very thin oxide film having a thickness of about 1 nm is inserted between ferromagnetic layers included in a pinned layer, electrons are mirror-reflected by the inserted very thin oxide film, and as a result, a magnetoresistance effect is significantly improved (Journal of Magnetism and Magnetic Materials, 210 (2000), L20–24).

While considering the above facts, the present inventors researched and developed an oxide film which achieves a mirror reflection effect of electrons and which achieves an antiferromagnetic exchange-coupling of two magnetic films. As a result of the research and development, the present inventors found that oxide films of Ru, Ir, Rh, and Re are exceptional oxide films that can achieve an antiferromagnetic exchange-coupling of two magnetic films. Furthermore, the present inventors also found that the oxide films of Ru, Ir, Rh, and Re have superior thermal stability as described below.

The metal oxide films of Ru, Ir, Rh, and Re are less easily diffused as compared to metal films of Ru, Ir, Rh, and Re. Specifically, in the metal oxide films of Ru, Ir, Rh, and Re, diffusion of Ru, Ir, Rh, and Re is not caused in an interface of the non-magnetic layer 104 even at 400° C. or more. Therefore, characteristics of the magnetoresistance effect device including such oxide films do not deteriorate. Furthermore, by any of the oxide films of Ru, Ir, Rh, and Re, the two magnetic films 105 and 106 can be antiferromagnetically exchange-coupled to each other through the oxide film. Thus, when using any of the oxide films of Ru, Ir, Rh, and Re as the non-magnetic layer 104, diffusion of Ru, Ir, Rh, and Re is not caused in an interface of the non-magnetic layer 104 even at 400° C. or more. As a result, a magnetoresistance effect device whose characteristics do not deteriorate, i.e., a thermally-stable magnetoresistance effect device 100, can be obtained.

When a metal film of Cu or the like is used as the non-magnetic layer 103, the magnetoresistance effect device 100 becomes a GMR device. In this GMR device, electrodes are provided on opposite side faces of the layered film of FIG. 1 so as to complete a magnetoresistance effect device. When an oxide film of Al or the like is used as the non-magnetic layer 103, the magnetoresistance effect device 100 becomes a TMR device. In this TMR device, electrodes are provided on upper and lower faces of the layered film of FIG. 1 so as to complete a magnetoresistance effect device.

In either of the GMR device and the TMR device, when the magnetization direction of the free layer 101 is antiparallel to that of the magnetic film 105 included in the pinned layer 102, the resistance of this magnetoresistance effect device is high. When the magnetization direction of the free layer 101 is parallel to that of the magnetic film 105 included in the pinned layer 102, the resistance of this magnetoresistance effect device is low. In each of these GMR and TMR devices, a magnetoresistance change rate (hereinafter, referred to as an "MR ratio") is higher than that of a conventional magnetoresistance effect device which uses NiFe or the like.

Figure 2:
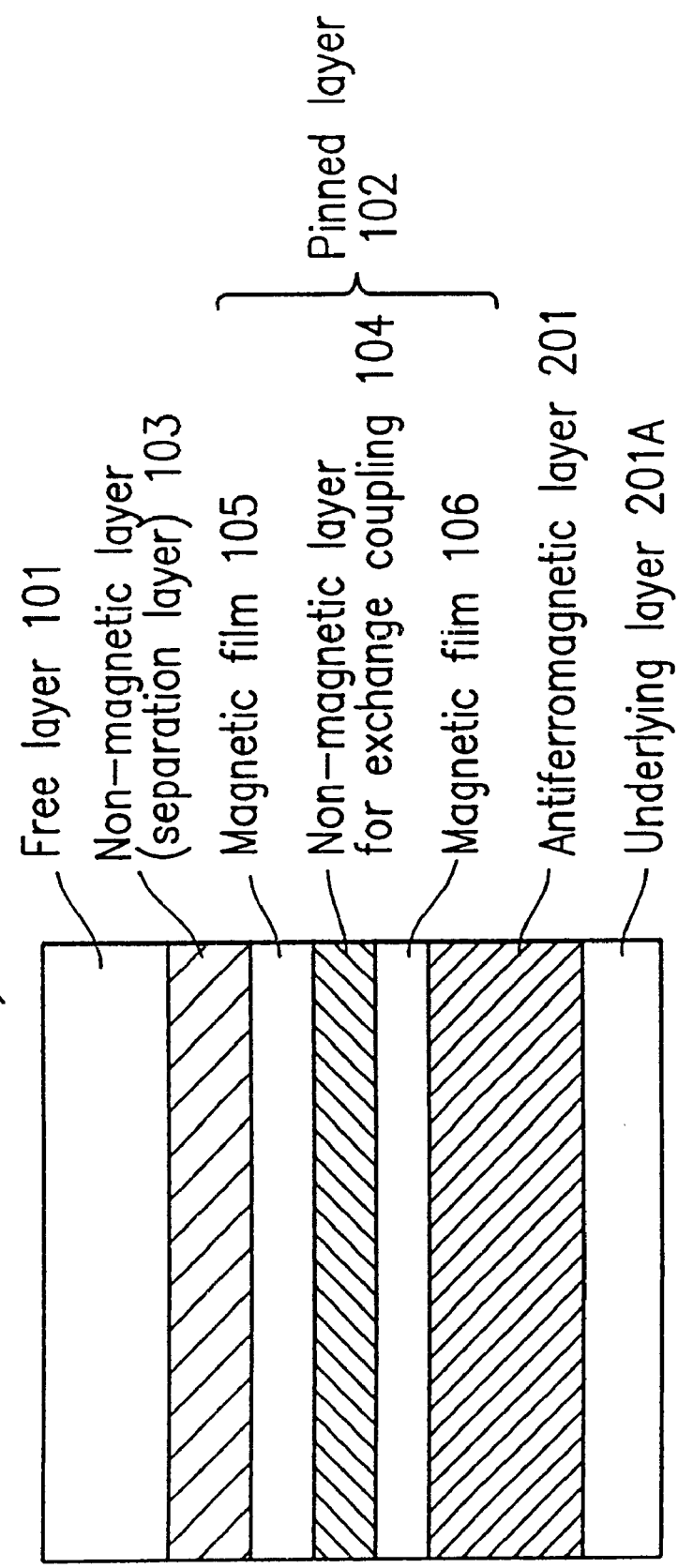

FIG. 2 shows a structure of a magnetoresistance effect device 200 which is another example of a magnetoresistance effect device according to the present invention. In FIG. 2, like elements are indicated by like reference numerals used for the magnetoresistance effect device 100 of FIG. 1, and detailed descriptions thereof are omitted.

Similar to the structure of the magnetoresistance effect device 100 of FIG. 1, also in the structure of FIG. 2, the pinned layer 102 includes the magnetic films 105 and 106 which are antiferromagnetically exchange-coupled to each other via the non-magnetic layer 104. A feature of the present invention is to use any of oxide films of Ru, Ir, Rh, and Re for the non-magnetic layer 104 which realizes an antiferromagnetic exchange-coupling. When using any of the oxide films of Ru, Ir, Rh, and Re as the non-magnetic layer 104, diffusion of Ru, Ir, Rh, and Re is not caused in an interface of the non-magnetic layer 104 even at 400° C. or more. As a result, a magnetoresistance effect device whose characteristics do not deteriorate, i.e., a thermally-stable magnetoresistance effect device 200, can be obtained.

The magnetoresistance effect device 200 further includes an antiferromagnetic layer 201 which is magnetically exchange-coupled to the pinned layer 102, and an underlying layer 201A mainly containing NiFeCr which is formed on a face (lower face) of the antiferromagnetic layer 201 which is opposite to a face on which the pinned layer 102 is formed.

In FIG. 2, the pinned layer 102 is exchange-coupled to the antiferromagnetic layer 201. With such a structure, the magnetization direction of the pinned layer 102 is fixed more strongly as compared with the structure shown in FIG. 1. Especially in this case, when a film mainly containing NiFeCr is used as the underlying layer 201A, an exchange-coupling characteristic of the antiferromagnetic layer 201 and the pinned layer 102 is improved. In this structure, in order to restrict effects of an exchange-coupling power of the antiferromagnetic layer 201 only on the pinned layer 102, it is desirable that the NiFeCr underlying layer 201A be a non-magnetic film.

In FIG. 2, a hard-magnetic film may be used in place of the antiferromagnetic layer 201. However, in such a case, when the magnetoresistance effect device is patterned into a minute shape, a magnetic field from the hard-magnetic film influences the free layer 101. Thus, in view of an application to a magnetic head or a memory device, it is desirable to use the antiferromagnetic layer 201 which does not cause an influence due to a magnetic field.

Figure 3:
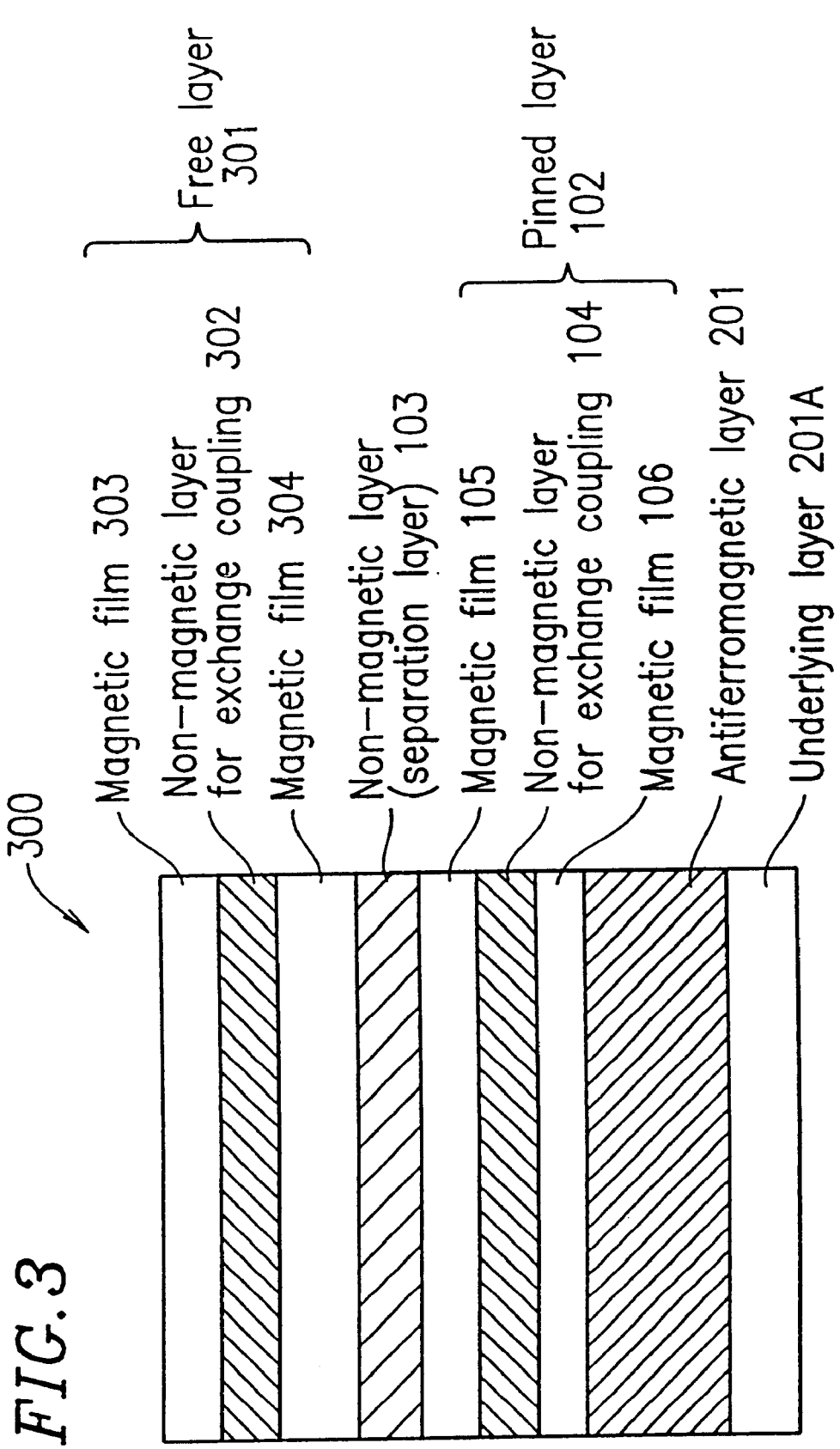

FIG. 3 shows a structure of a magnetoresistance effect device 300 which is still another example of a magnetoresistance effect device according to the present invention. In FIG. 3, like elements are indicated by like reference numerals used for the magnetoresistance effect device 200 of FIG. 2, and detailed descriptions thereof are omitted.

Similar to the structure of the magnetoresistance effect device 100 of FIG. 1, also in the structure of FIG. 3, the pinned layer 102 includes the magnetic films 105 and 106 which are antiferromagnetically exchange-coupled to each other via the non-magnetic layer 104. A feature of the present invention is to use any of oxide films of Ru, Ir, Rh, and Re for the non-magnetic layer 104 which realizes an antiferromagnetic exchange-coupling. When using any of the oxide films of Ru, Ir, Rh, and Re as the non-magnetic layer 104, diffusion of Ru, Ir, Rh, and Re is not caused in an interface of the non-magnetic layer 104 even at 400° C. or more. As a result, a magnetoresistance effect device whose characteristics do not deteriorate, i.e., a thermally-stable magnetoresistance effect device 300, can be obtained.

The magnetoresistance effect device 300 is different from the magnetoresistance effect device 200 of FIG. 2 in that a free layer 301 is used in place of the free layer 101. The free layer 301 includes anon-magnetic film 302 for exchange-coupling, and magnetic films 303 and 304 which are anti-ferromagnetically exchange-coupled to each other via the non-magnetic film 302. The non-magnetic film 302 includes any of the oxide films of Ru, Ir, Rh, and Re. In the case where the magnetic film 303 has an intensity of magnetization M1 and a thickness t1 and the magnetic film 304 has an intensity of magnetization M2 and a thickness t2, a product of M1 and t1, i.e., M1×t1, is set so as to be substantially different from a product of M2 and t2, i.e., M2×t2.

The structure shown in FIG. 3 must be structured such that (M1×t1−M2×t2) is not equal to zero. To this end, if two films having a same composition are used, the two films may be formed so as to have different thicknesses. Alternatively, even when the two films have the same thickness, it is only necessary to form the two films such that intensity of magnetization is different between the two films.

In each of the magnetoresistance effect devices 100 and 200 shown in FIGS. 1 and 2, if the width of the device is reduced while the thickness thereof is maintained constant, i.e., the size of the device is reduced, a reversed magnetic field generally increases in inverse proportion to the width of the device. If the reversed magnetic field becomes large, the sensitivity of the magnetoresistance effect device deteriorates. As a result, in a memory device using such a magnetoresistance effect device, a write current in a word line is increased. However, according to the present invention, since the difference between a value of (M1×t1) and a value of (M2×t2) have an effect on a magnetic characteristic of the entire free layer 301, the above problems, i.e., increase of the write current and deterioration of sensitivity due to the reduction of device size, can be eliminated by adjusting the difference between a value of (M1×t1) and a value of (M2×t2).

Furthermore, when the size of the magnetoresistance effect device is reduced, information written in a free layer of a memory device produced using the magnetoresistance effect device may be affected by thermal fluctuation. However, if the magnetoresistance effect device is produced so as to have a structure shown in FIG. 3, i.e., produced so as to include the free layer 301 where the two magnetic films 303 and 304 are antiferromagnetically exchange-coupled to each other via the non-magnetic film 302, a thermally-stable memory device which is resistant to thermal fluctuation can be achieved based on such a magnetoresistance effect device. In this case, it is desirable to set the difference in the products of the intensity of magnetization and the thickness between the two magnetic films 303 and 304, i.e., the difference between a value of (M1×t1) and a value of (M2×t2), to a value which is greater than 0 and equal to or smaller than 2 T(tesla) nm.

Figure 4:
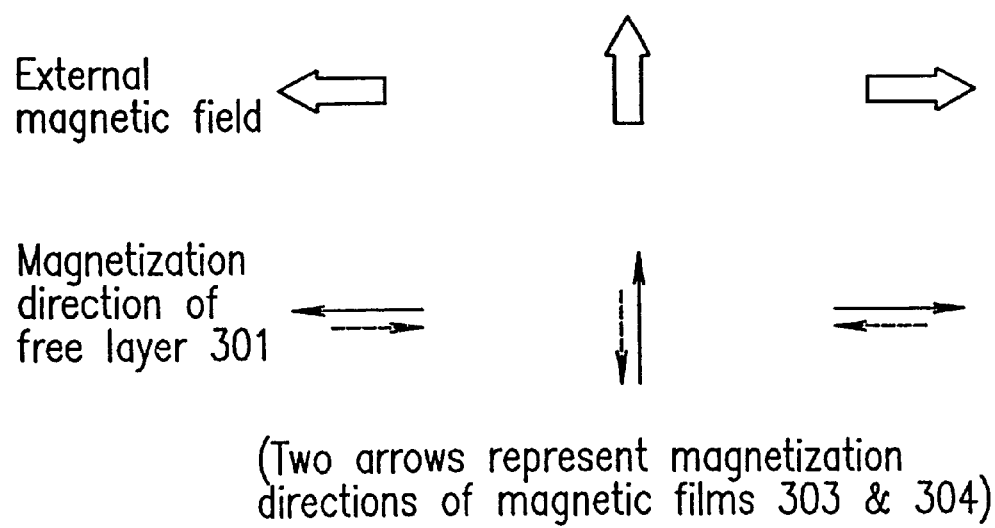
FIG. 4 illustrates rotation of a magnetization direction of a free layer in a magnetoresistance effect device according to the present invention which is caused by an external magnetic field.

Thus, the direction of the free layer 301, which includes the magnetic films 303 and 304 antiferromagnetically exchange-coupled to each other via the non-magnetic film 302, is rotated such that the magnetization direction represented by (M1×t1−M2×t2) in the free layer 301 is parallel to the direction of an external magnetic field while maintaining an antiferromagnetic exchange-coupling as shown in FIG. 4. Even if the free layer 301 is structured so as to include the two magnetic films 303 and 304 antiferromagnetically exchange-coupled to each other via the non-magnetic film 302, the sensitivity of the magnetoresistance effect device is low unless the device operates as shown in FIG. 4. That is, it is important to design the device so as to operate as shown in FIG. 4.

Furthermore, when the pinned layer 102 includes the two magnetic films 105 and 106 antiferromagnetically exchange-coupled to each other via the non-magnetic film 104 as shown in FIG. 3, a thermally-stable magnetoresistance effect device whose magnetization direction is less easily rotated by an external magnetic field can be obtained. In the pinned layer 102, not as in the free layer 301, the two magnetic films 105 and 106 may have the same intensity of magnetization and the same thickness. In the example illustrated in FIG. 3, the antiferromagnetic layer 201 is formed on the pinned layer 102. However, according to the present invention, the antiferromagnetic layer 201 may not be provided.

In the magnetoresistance effect devices 100 and 200 shown in FIGS. 1 and 2, one of the magnetic films 105 and 106 included in the pinned layer 102 may be formed of a magnetic film of CoFeB, CoNbB, CoFeNbB, or the like, which mainly contains cobalt (Co) and contains 5%–30% of boron (B). With such a structure, a soft-magnetic characteristic of the free layer 101 or 201 is improved, and as a result, a device with improved sensitivity can be obtained.

Similarly, in the magnetoresistance effect device 300 shown in FIG. 3, at least one of the magnetic films 105 and 106 included in the pinned layer 102 and the magnetic films 303 and 304 included in the free layer 301 may be formed of a magnetic film of CoFeB, CoNbB, CoFeNbB, or the like, which mainly contains cobalt (Co) and contains 5%–30% of boron (B). With such a structure, a soft-magnetic characteristic of the free layer 301 is improved, and as a result, a device with improved sensitivity can be obtained.

In FIGS. 1 through 3, it is desirable to use an alloy film of Co, Fe, Co—Fe, Ni—Fe, Ni—Fe—Co, etc., or a layered film thereof, as the magnetic films 105 and 106 included in the pinned layer 102 and the magnetic films 303 and 304 included in the free layer 301. Furthermore, it is desirable that the magnetic films 303 and 304 are formed of a film which exhibits a soft-magnetic characteristic. For example, it is desirable to form the magnetic films 303 and 304 mainly of a Ni—Fe based magnetic film or a Ni—Fe—Co based magnetic film.

In FIGS. 1 through 3, the magnetic films 105 and 106 included in the pinned layer 102 may be formed of hard-magnetic films. An example of a hard-magnetic film is a CoPt-based film. Furthermore, the magnetic films 105 and 106 may be formed by a layered film including a hard-magnetic film and a magnetic film. An example of the layered film is CoPt/CoFe. Furthermore, the pinned layer 102 may include the magnetic films 105 and 106 which is exchange-coupled to the antiferromagnetic layer 201.

In FIGS. 2 and 3, it is desirable that the antiferromagnetic layer 201 be formed of a T—Mn based alloy film (herein, "T" denotes one or more elements selected from Ni, Pt, Ir, Pd, Rh, Ru, and Cr). Specific examples of the T—Mn based alloy include PtMn, RdPtMn, NiMn, IrMn, CrPtMn, RuRhMn, etc. Furthermore, it is desirable that the underlying layer 201A which is provided under the antiferromagnetic layer 201 be mainly formed of a material mainly including NiFeCr. In this case, it is desirable that the NiFeCr material be non-magnetic. If the composition of the NiFeCr material contains 20 atomic percents or more of Cr, the NiFeCr material is non-magnetic at room temperature. Furthermore, similar to the structure of the free layer 301, the underlying layer 201A may be formed of a non-magnetic film and two magnetic layers which are antiferromagnetically exchange-coupled to each other via the non-magnetic film.

In order to obtain a TMR device, it is desirable that the non-magnetic layer 103 which magnetically separates a free layer and a pinned layer is formed of an insulative film of AlO, AlN, AlNO, BN, etc. In order to obtain a GMR device, it is desirable that the non-magnetic layer 103 is formed by a metal film (non-magnetic conductive film) of Cu, Au, Ag, Cr, Ru, etc. When a half metal film having a large spin-polarizability is provided between the non-magnetic layer 103 and the free layer 101 or 301 or between the non-magnetic layer 103 and the pinned layer 102, a larger MR ratio can be obtained. An example of the half metal film having a large spin-polarizability is a $Fe_3O_4$ film. When using the $Fe_3O_4$ film, a desirable thickness thereof is 1 nm or smaller.

Figure 5:
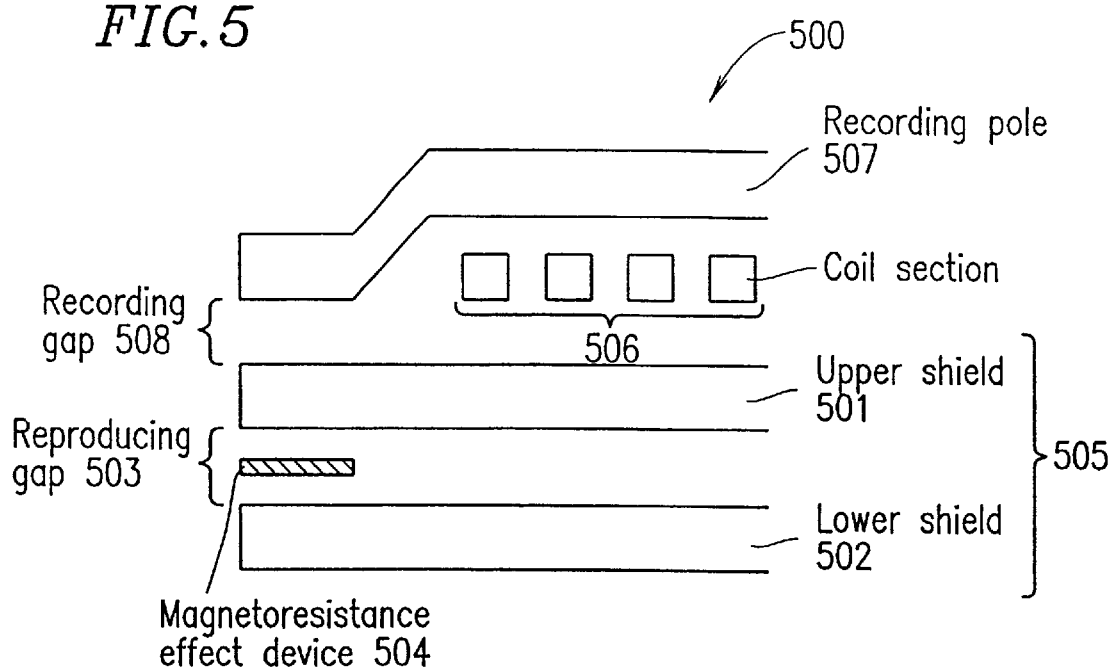
FIG. 5 shows an exemplary magnetic head having a shield which is produced using a magnetoresistance effect device according to the present invention.

By using the above-described magnetoresistance effect devices according to the present invention, a magnetic head with superior thermal stability can be produced. FIG. 5 shows a structure of a magnetic head 500 produced using a magnetoresistance effect device according to the present invention. The magnetic head 500 includes a reproduction head section 505. The reproduction head section 505 includes an upper shield 501, a lower shield 502, and a magnetoresistance effect device 504 of the present invention which is provided in a reproducing gap 503 between the upper shield 501 and the lower shield 502. Each of the upper shield 501 and the lower shield 502 is made of a magnetic material.

When an electric current flows through a coil section 506, a signal is recorded in a recording medium (not shown) by a portion of a magnetic field which is leaked from a recording gap 508 between the upper shield 501 and a recording pole 507. The magnetoresistance effect device 504 provided in the reproducing gap 503 (shield gap) reads a signal magnetic field from a recording medium (not shown) to reproduce a signal recorded on the recording medium.

The magnetoresistance effect device 504 is connected to lead lines (not shown). In the case where the magnetoresistance effect device 504 is a GMR device, the lead lines are connected to left and right sides of the magnetoresistance effect device 504 and insulated from the two shields 501 and 502. In the case where the magnetoresistance effect device 504 is a TMR device, the lead lines are connected to upper and lower sides of the magnetoresistance effect device 504. In the case where the magnetoresistance effect device 504 is a TMR device, the device 504 may be structured such that the lead lines connected to the upper and lower sides thereof are connected to the upper and lower shields 501 and 502, respectively, such that the upper and lower shields 501 and 502 also function as a part of the lead lines. With such a structure, the reproducing gap 503 can be formed so as to be narrower.

Thus, according to the present invention, a magnetic head 500 which has the reproduction head section 505 including the magnetoresistance effect device 504 with superior thermal stability can be obtained.

Figure 6:
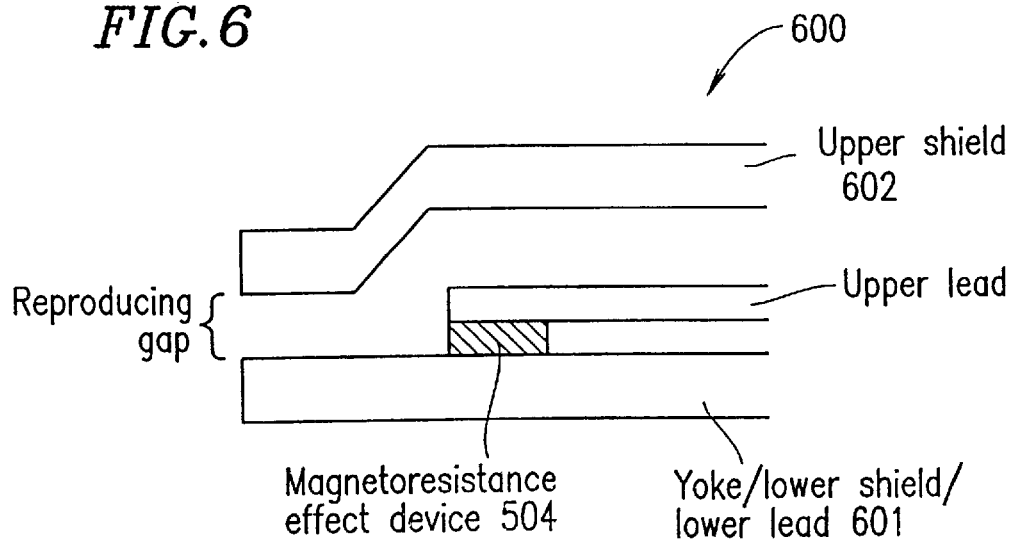
FIG. 6 shows an exemplary magnetic head having a yoke which is produced using a magnetoresistance effect device according to the present invention.

FIG. 6 shows a structure of another magnetic head 600 produced using a magnetoresistance effect device according to the present invention. The magnetic head 600 includes an upper shield 602, a lower shield 601, and a magnetoresistance effect device 504 provided between the upper shield 602 and the lower shield 601. The lower shield 601 is made of a magnetic material and also functions as a yoke section (magnetic flux guiding section). The example illustrated in FIG. 6 is an exemplary structure of a magnetic head when the magnetoresistance effect device 504 is a TMR device.

As shown in FIG. 6, a signal magnetic field from a recording medium (not shown) enters a reproducing gap between the upper shield 602 and the lower shield 601 and proceeds along the lower shield 601, which also functions as a yoke section, to the magnetoresistance effect device 504. Then, the magnetoresistance effect device 504 connected to the yoke section 601 reads the signal magnetic field from the recording medium. The magnetoresistance effect (TMR) device 504 is connected to an upper lead. The lower shield 601 also functions as a lower lead which is connected to the magnetoresistance effect device 504. A portion or an entirety of a free layer included in the magnetoresistance effect device 504 may function as the lower shield 601. If the magnetoresistance effect device 504 is a GMR device, the magnetoresistance effect device 504 must be insulated from the yoke 601.

Thus, according to the present invention, a magnetic head 600 which has a yoke including the magnetoresistance effect device 504 with superior thermal stability can be obtained.

Figure 7:
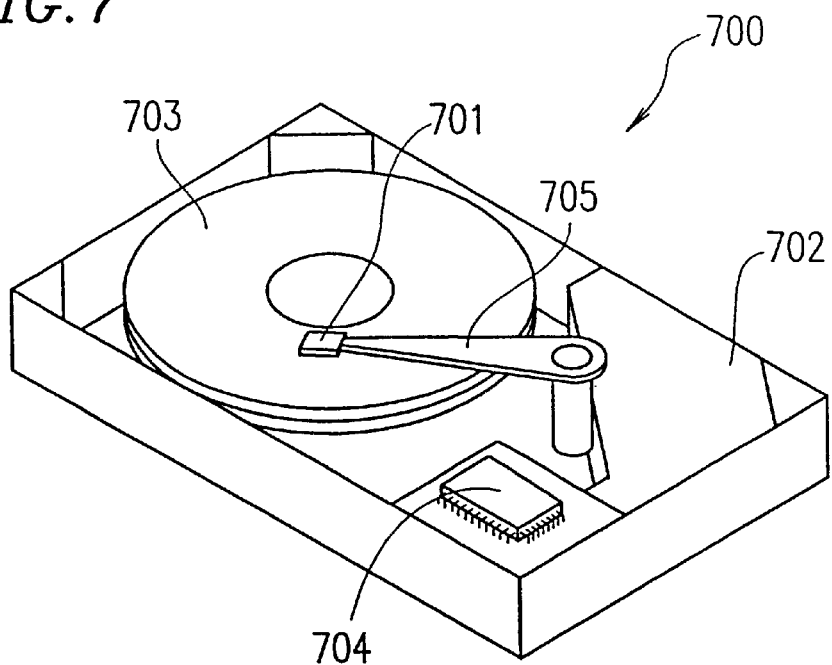
FIG. 7 shows an example of a magnetic recording reproduction apparatus which is produced using a magnetoresistance effect device according to the present invention.

FIG. 7 is a perspective view showing a magnetic recording/reproduction apparatus 700 which uses a magnetic head including a magnetoresistance effect device according to the present invention. With a magnetic head including a reproduction head according to the present invention, a magnetic recording/reproduction apparatus, such as a hard disk drive (HDD) or the like, can be produced. As shown in FIG. 7, the magnetic recording/reproduction apparatus 700 includes: a magnetic head 701 for recording or reproducing information in a magnetic recording medium 703; an arm 705 on which the magnetic head 701 is mounted; a driving section 702 for driving the arm 705; and a signal processing section 704 for processing a signal reproduced from the magnetic recording medium 703 by the magnetic head 701 or a signal to be recorded in the magnetic recording medium 703 by the magnetic head 701.

The driving section 702 drives the arm 705 so as to place the magnetic head 701 at a predetermined position over the magnetic recording medium 703. In a reproduction operation, the magnetic head 701 reads a signal recorded in the magnetic recording medium 703. The signal processing section 704 reproduction-processes the signal read by the magnetic head 701 from the magnetic recording medium 703. In a recording operation, the signal processing section 704 recording-processes a signal to be recorded in the magnetic recording medium 703. The magnetic head 701 records the signal processed by the signal processing section 704 in the magnetic recording medium 703. Thus, according to the present invention, a magnetic recording/reproduction apparatus which uses a magnetic head including a reproduction head with superior thermal stability can be produced.

Figure 8:
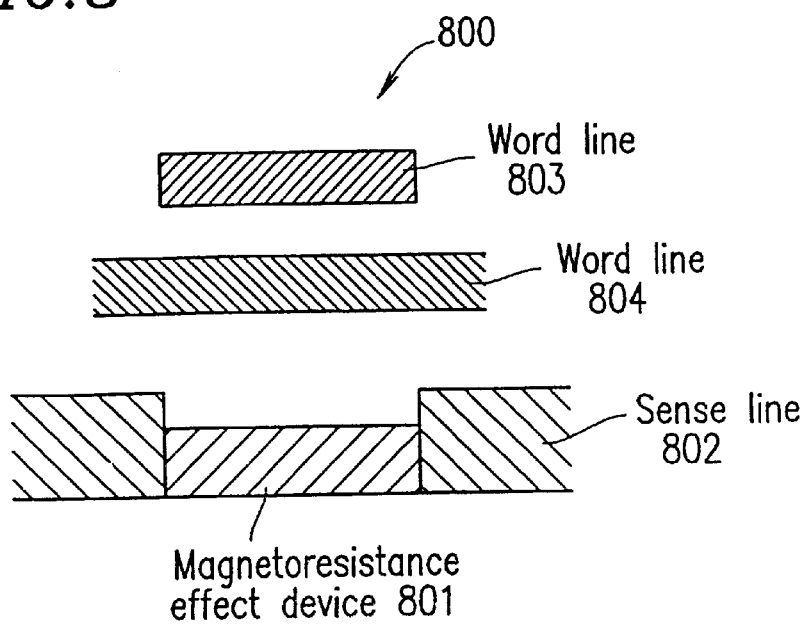
FIG. 8 shows an example of a memory device which is produced using a GMR film according to the present invention.
Figure 9:
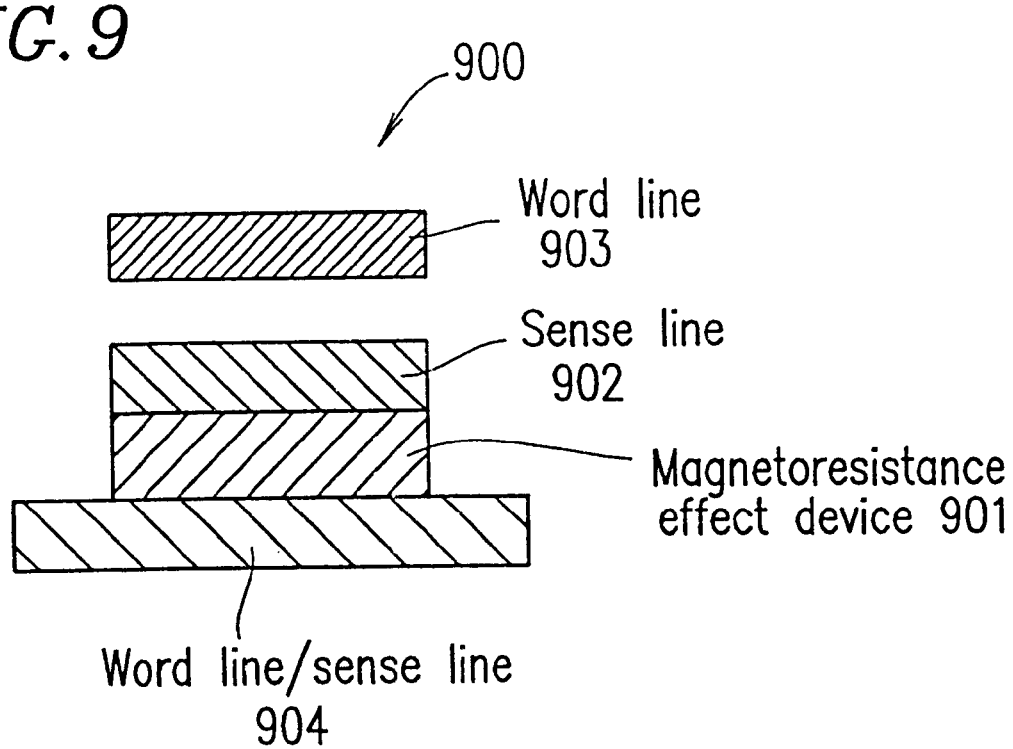
FIG. 9 shows an example of a memory device which is produced using a TMR film according to the present invention.

Furthermore, a memory device can be produced by using a magnetoresistance effect device according to the present invention where the magnetoresistance effect device is provided with word lines for generating a magnetic field and sense lines for reading a resistance of the magnetoresistance effect device as shown in FIGS. 8 and 9.

FIG. 8 shows a structure of a memory device 800 produced using a magnetoresistance effect device 801 of the present invention as a GMR device. The memory device 800 includes a magnetoresistance effect device 801 as a GMR device. At left and right sides of the magnetoresistance effect device 801, sense lines 802 for reading information recorded in the magnetoresistance effect device 801 are connected. The memory device 800 also has two word lines 803 and 804 for writing information in the magnetoresistance effect device 801.

In the case where a plurality of memory devices 800 having such a structure are arranged in a matrix, information can be selectively written in one of a plurality of magnetoresistance effect devices 801 by a synthetic magnetic field from the two word lines 803 and 804. The direction of a current flow in the word line 803 is perpendicular to the cross section of the memory device 800 shown in FIG. 8. The direction of a current flow in the word line 804 is along the horizontal direction on the cross section of the memory device 800 shown in FIG. 8.

FIG. 9 shows a structure of a memory device 900 produced using a magnetoresistance effect device 901 of the present invention as a TMR device. The memory device 900 includes a magnetoresistance effect device 901 as a TMR device. The memory device 900 includes a word line 903 for writing information in the magnetoresistance effect device 901. At upper and lower sides of the magnetoresistance effect device 901, a sense line 902 and a word line 904 which also functions as a sense line are connected, respectively.

In the case where a plurality of memory devices 900 having such a structure are arranged in a matrix, information can be selectively written in one of a plurality of magnetoresistance effect devices 901 by a synthetic magnetic field from the two word lines 903 and 904. The direction of a current flow in the word line 903 is perpendicular to the cross section of the memory device 900 shown in FIG. 9. The direction of a current flow in the word line 904 is along the horizontal direction on the cross section of the memory device 900 shown in FIG. 9.

A difference between the memory device 800 of FIG. 8 and the memory device 900 of FIG. 9 lies in that when a plurality of memory devices are arranged in a matrix, the memory devices of the memory device 800 are connected to the sense line 802 in series whereas the memory devices of the memory device 900 are connected to the sense line 902 in parallel.

In each of the memory devices 800 and 900, electric currents flowing in the word lines 803 and 804 or in the word line 903 and the word line/sense line 904 generate a magnetic field, and the generated magnetic field inverts the magnetization direction of a free layer included in the magnetoresistance effect device 801 or 901, whereby information is recorded.

The reading of information is achieved by reading the memory state (resistance) of the magnetoresistance effect device by using the sense line 802 or the sense line 902 and the sense line/word line 904. When the magnetization direction of the free layer is parallel to that of the pinned layer included in the magnetoresistance effect device 801 or 901, the resistance of the device is low. When the magnetization direction of the free layer is antiparallel to that of the pinned layer, the resistance of the device is high.

The memory devices 800 and 900 are magnetic memories, i.e., non-volatile memories, and therefore are different from a DRAM, which is a volatile memory. Furthermore, the memory devices 800 and 900 are different from a semiconductor flash memory in that writing/reading of information in the memory devices 800 and 900 can be performed an infinite number of times in principle, a time required for writing/deleting information is as short as the order of nanoseconds, and a non-destructive reading is possible.

The operation principle of a one-bit memory device has been described above. However, when producing a practical memory device, such one-bit memory devices are arranged in a matrix. In this case, when writing information in a memory device at address (N,M) in the matrix, magnetic fields are generated by two word lines which cross above the memory device at address (N,M), and information is written by a synthetic magnetic field of the generated magnetic fields. Reading of information is achieved by reading the magnitude of resistance of the memory device at address (N,M) through a sense line connected to the memory device.

EXAMPLES

Example 1

The magnetoresistance effect device 100 shown in FIG. 1 was fabricated by sputtering using Si for a substrate and Cr, Pt, CoPt, Ir, CoFe, Al, Cu, and NiFe for targets. In the first step, a Cu/Pt/Cr film having a thickness of 50 nm was formed on the Si substrate as a lower electrode. Then, on the Cu/Pt/Cr film, a magnetoresistance effect device having the following structure was fabricated.

Example Sample 1: CoPt(25)/CoFe(3)/IrO(0.8)/
CoFe(3)/AlO(1.4)/CoFe(1)/NiFe(3), where the number in parentheses represents the thickness (nm) of the film. IrO and AlO films were formed by natural oxidation after the formation of Ir and Al films.

In example sample 1, CoPt and CoFe correspond to the magnetic film 106 shown in FIG. 1. IrO corresponds to the non-magnetic layer 104 for exchange-coupling. CoFe corresponds to the magnetic film 105. AlO corresponds to the non-magnetic film 103. CoFe and NiFe correspond to the free layer 101.

A magnetoresistance effect device of 1 $\mu$m×1 $\mu$m was formed from a film of example sample 1 by photolithography. A periphery of the magnetoresistance effect device was insulated by AlO, and a through hole was made. Over the resultant structure, a Cu/Pt film is formed so as to have a thickness of 50 nm as an upper electrode. The thus-fabricated magnetoresistance effect device was thermally treated up to 400° C. Then, a magnetic field of 500 Oe was applied to the magnetoresistance effect device at room temperature, and the magnetoresistance change rate (MR ratio) was measured. A result of the measurement is shown in Table 1:

TABLE 1

| Thermal treatment temperature (° C.) | 300 | 320 | 340 | 360 | 380 | 400 |
|---|---|---|---|---|---|---|
| MR ratio of example sample 1 (%) | 31 | 31 | 31 | 31 | 31 | 28 |

As seen from Table 1, the MR ratio is substantially maintained with increasing temperature. Thus, the magnetoresistance effect device 100 has superior thermal stability.

Example 2

The magnetoresistance effect device 200 shown in FIG. 2 was fabricated by sputtering using Si for a substrate and Pt, Ru, PtMn, CoFe, Cu, Al, NiFe, NiFeCr for targets. In the first step, a Cu/Pt film having a thickness of 50 nm was formed on the Si substrate as a lower electrode. Then, on the Cu/Pt film, a magnetoresistance effect device having the following structure was fabricated.

Example Sample 2: PtMn(25)/CoFe(3)/RuO(0.8)/
CoFe(3)/AlO(1.4)/CoFe(1)/NiFe(4)

Furthermore, a magnetoresistance effect device including an underlayer of NiFeCr for the PtMn layer was fabricated:
Example Sample 2A: NiFeCr(4)/PtMn(25)/CoFe(3)/RuO(0.8)/CoFe(3)/AlO(1.4)/CoFe(1)/NiFe(4)

For comparison, a sample having a conventional structure shown below was fabricated.

Conventional Sample A: PtMn(25)/CoFe(6)/AlO
(1.2)/CoFe(1)/NiFe(4)

In example sample 2, PtMn corresponds to the antiferromagnetic layer 201 shown in FIG. 2. CoFe corresponds to the magnetic film 106. RuO corresponds to the non-magnetic layer 104 for exchange-coupling. CoFe corresponds to the magnetic film 105. AlO corresponds to the non-magnetic film 103. CoFe and NiFe correspond to the free layer 101. In example sample 2A, NiFeCr corresponds to the underlying layer 201A. The other components are the same as those of example sample 2.

The RuO and AlO films were formed by natural oxidation after the formation of Ru and Al films. After these samples were thermally treated at 280° C. in a magnetic field for two hours, magnetoresistance effect devices of 1 μm×1 μm were formed from films of example sample 2, example sample 2A, and conventional sample A by photolithography. A periphery of each of the resultant magnetoresistance effect devices was insulated by AlO, and a through hole was made. Over the resultant structure, a Cu/Pt film is formed so as to have a thickness of 50 nm as an upper electrode. The thus-fabricated magnetoresistance effect devices were thermally treated up to 400° C. Then, a magnetic field of 500 Oe was applied to the magnetoresistance effect devices, and the MR ratio was measured. A result of the measurement is shown in Table 2:

TABLE 2

| Thermal treatment temperature (° C.) | 300 | 320 | 340 | 360 | 380 | 400 |
|---|---|---|---|---|---|---|
| MR ratio of example sample 2 (%) | 45 | 45 | 45 | 45 | 43 | 35 |
| MR ratio of example sample 2A (%) | 46 | 46 | 46 | 46 | 44 | 39 |
| MR ratio of conventional sample A (%) | 42 | 40 | 18 | 2 | 0 | 0 |

As seen from Table 2, we found that the magnetoresistance effect device 200 has superior thermal stability as compared with the conventional device.

Example 3

The magnetoresistance effect device 200 shown in FIG. 2 was fabricated by sputtering using Si for a substrate and Ta, NiFeCr, RuO2, PtMn, CoFe, Cu, CoFeB for targets. In the first step, a Ta/NiFeCr film was formed on the Si substrate so as to have a thickness of 6 nm. Then, on the Ta/NiFeCr film, a magnetoresistance effect device having the following structures were fabricated.

Example Sample 3: PtMn(15)/CoFe(2)/RuO(0.8)/
CoFe(2)/Cu(2.4)/CoFe(2)/Cu(1)/Ta(3)

Example Sample 3A: PtMn(15)/CoFeB(1)/
CoFe(1.5)/RuO(0.8)/CoFe(2)/Cu(2.4)/CoFe(2)/
Cu(1)/Ta(3)

(where the "RuO" film is an oxide film of Ru but does not mean that the ratio between Ru and O is 1:1. This is the same for IrO and AlO as well.)

For comparison, a sample having a conventional structure shown below was fabricated.

Conventional Sample B: PtMn(15)/CoFe(4)/Cu
(2.4)/CoFe(2)/Cu(1)/Ta(3)

In example sample 3, PtMn corresponds to the antiferromagnetic layer 201 shown in FIG. 2. CoFe corresponds to the magnetic film 106. RuO corresponds to the non-magnetic layer 104 for exchange-coupling. CoFe corresponds to the magnetic film 105. Cu corresponds to the non-magnetic film 103. CoFe corresponds to the free layer 101. Cu and Ta correspond to a cap layer (not shown). In example sample 3A, CoFeB and CoFe correspond to the magnetic film 106. The other components are the same as those of example sample 3.

After these samples were thermally treated at 280° C. in a magnetic field for two hours, films of example sample 3, example sample 3A, and conventional sample B were formed into structures of 0.5 μm×1 μm by photolithography, and electrodes were formed thereon so as to produce magnetoresistance effect devices. The MR ratio of each of the magnetoresistance effect devices was measured at room temperature, and the coercive force HC of the free layer of each magnetoresistance effect device was examined. A result of the examination is shown below.

|  | Sample 3 | Sample 3A | Sample B |
|---|---|---|---|
| Hc (Oe) | 6 | 1 | 9 |

As seen from the result, we found that, in a magnetoresistance effect device where CoFeB is used in the magnetic film 106 of the pinned layer 102, the soft-magnetic characteristic of the free layer 101 was significantly improved. Thereafter, magnetoresistance effect devices were thermally treated up to 400° C. Then, a magnetic field of 500 Oe was applied to the magnetoresistance effect devices at room temperature, and the MR ratio was measured. A result of the measurement is shown in Table 3:

TABLE 3

| Thermal treatment temperature (° C.) | 300 | 320 | 340 | 360 | 380 | 400 |
|---|---|---|---|---|---|---|
| MR ratio of example sample 3 (%) | 11 | 11 | 11 | 11 | 9 | 1 |
| MR ratio of example sample 3A (%) | 10 | 10 | 10 | 10 | 8 | 1 |
| MR ratio of conventional sample B (%) | 9 | 9 | 2 | 0 | 0 | 0 |

As seen from Table 3, we found that the magnetoresistance effect device of the present invention has superior thermal stability as compared with the conventional device.

Example 4

The magnetoresistance effect device 300 shown in FIG. 3 was fabricated by sputtering using Si for a substrate and Pt, PtMn, CoFe, Ru, Al, Cu, NiFe, NiFeCr for targets. In the first step, a Cu/Pt film having a thickness of 50 nm was formed as a lower electrode on the Si substrate. Then, on the Cu/Pt film, a magnetoresistance effect device having the following structure was fabricated.

Example Sample 4: PtMn(25)/CoFe(3)/RuO(0.8)/
CoFe(3)/AlO(1.4)/NiFe(3)/RuO(0.8)/NiFe(2)

Furthermore, a magnetoresistance effect device including an underlayer of NiFeCr was fabricated:

Example Sample 4A: NiFeCr(4)/PtMn(25)/CoFe(3)/
RuO(0.8)/CoFe(3)/AlO(1.4)/NiFe(3)/RuO(0.8)/
NiFe(2)

For comparison, a sample having a conventional structure shown below was fabricated.

Conventional Sample C: PtMn(25)/CoFe(3)/Ru(0.7)/CoFe(3)/AlO(1.4)/NiFe(5)

In example sample 4, PtMn corresponds to the antiferromagnetic layer 201 shown in FIG. 3. CoFe corresponds to the magnetic film 106. RuO corresponds to the non-magnetic layer 104 for exchange-coupling. CoFe corresponds to the magnetic film 105. AlO corresponds to the non-magnetic film 103. NiFe corresponds to the magnetic film 304. RuO corresponds to the non-magnetic layer 302 for exchange-coupling. NiFe corresponds to the magnetic film 303. In example sample 4A, NiFeCr corresponds to the underlying film 201A, and the other components are the same of those of example sample 4.

After these samples were thermally treated at 280° C. in a magnetic field for two hours, films of example sample 4, example sample 4A, and conventional sample C were formed into structures of 0.2 μm×0.3 μm by photolithography. A periphery of each of the resultant structures was insulated by AlO, and a through hole was made. Over the resultant structure, a Cu/Pt film is formed so as to have a thickness of 50 nm as an upper electrode. The thus-fabricated magnetoresistance effect devices were thermally treated up to 400° C. Then, a magnetic field of 500 Oe was applied to the magnetoresistance effect devices, and the MR ratio was measured. A result of the measurement is shown in Table 4:

TABLE 4

| Thermal treatment temperature (° C.) | 300 | 320 | 340 | 360 | 380 | 400 |
|---|---|---|---|---|---|---|
| MR ratio of example sample 4 (%) | 41 | 41 | 41 | 41 | 40 | 37 |
| MR ratio of example sample 4A (%) | 42 | 42 | 42 | 42 | 42 | 39 |
| MR ratio of conventional sample C (%) | 41 | 41 | 28 | 2 | 0 | 0 |

As seen from Table 4, we found that the magnetoresistance effect device of the present invention has superior thermal stability as compared with the conventional device. The dependence of the MR ratio on the measured magnetic field H was also examined. A result of the examination is shown below:

| | H = 40 Oe | H = 80 Oe | H = 120 Oe |
|---|---|---|---|
| Example Sample 4 | MR = 39% | MR = 40% | MR = 41% |
| Example Sample 4A | MR = 39% | MR = 41% | MR = 42% |
| Conventional Sample C | MR = 4% | MR = 28% | MR = 39% |

As seen from this result, the magnetoresistance effect device 300 exhibits a sufficiently large MR ratio even when the applied magnetic field is weak. This is because the free layer 301 is formed by the magnetic films 303 and 304 which are antiferromagnetically exchange-coupled via the non-magnetic layer 302, and therefore, the effective thickness of the NiFe film of the free layer 301 against an external magnetic field is considered to be about 1 nm. On the other hand, the thickness of an uppermost NiFe layer in conventional sample C is 5 nm. Therefore, if the device size is as small as that of sample C, a reversed magnetic field becomes large. Furthermore, as the magnetic field becomes smaller, rotation of the magnetization direction of the free layer becomes more difficult. Thus, it is assumed that a large MR ratio cannot be conventionally obtained with a weak magnetic field for the above reasons. Further still, asymmetry of an MR curve of each of the above magnetoresistance effect devices was examined. Substantially no asymmetry was found in example samples 4 and 4A, whereas some asymmetry was found in conventional sample C.

Example 5

The magnetoresistance effect device 300 shown in FIG. 3 was fabricated by sputtering using Si for a substrate and Ta, NiFeCr, RuO2, PtMn, CoFe, Cu, and NiFe for targets. In the first step, a Ta/NiFeCr film was formed on the Si substrate so as to have a thickness of 6 nm. Then, on the Ta/NiFeCr film, a magnetoresistance effect device having the following structure was fabricated.

Example Sample 5: PtMn(15)/CoFe(2)/RuO(0.8)/CoFe(2)/Cu(2.4)/CoFe(1)/NiFe(1)/RuO(0.8)/NiFe(1.5)/Ta(3)

For comparison, a sample having a conventional structure shown below was fabricated.

Conventional Sample D: PtMn(15)/CoFe(2)/Ru(0.7)/CoFe(2)/Cu(2.4)/CoFe(1)/NiFe(2.5)/Ta(3)

In example sample 5, PtMn corresponds to the antiferromagnetic layer 201 shown in FIG. 3. CoFe corresponds to the magnetic film 106. RuO corresponds to the non-magnetic layer 104 for exchange-coupling. CoFe corresponds to the magnetic film 105. Cu corresponds to the non-magnetic film 103. CoFe and NiFe correspond to the magnetic film 304. RuO corresponds to the non-magnetic layer 302 for exchange-coupling. NiFe corresponds to the magnetic film 303. Ta corresponds to a cap layer (not shown).

After these samples were thermally treated at 280° C. in a magnetic field for two hours, films of example sample 5 and conventional sample D were formed into structures of 0.2 μm×0.3 μm by photolithography, and electrodes were formed thereon so as to produce magnetoresistance effect devices. The thus-fabricated magnetoresistance effect devices were thermally treated up to 400° C. Then, a magnetic field of 500 Oe was applied to the magnetoresistance effect devices, and the MR ratio was measured. A result of the measurement is shown in Table 5:

TABLE 5

| Thermal treatment temperature (° C.) | 300 | 320 | 340 | 360 | 380 | 400 |
|---|---|---|---|---|---|---|
| MR ratio of example sample 5 (%) | 9 | 9 | 9 | 9 | 8 | 1 |
| MR ratio of conventional sample D (%) | 9 | 9 | 4 | 0 | 0 | 0 |

As seen from Table 5, we found that the magnetoresistance effect device 300 of the present invention has superior thermal stability as compared with the conventional device. The dependence of the MR ratio on the measured magnetic field H was also examined. A result of the examination is shown below:

| | H = 40 Oe | H = 80 Oe | H = 120 Oe |
|---|---|---|---|
| Example Sample 5 | MR = 8% | MR = 9% | MR = 9% |
| Conventional Sample D | MR = 2% | MR = 6% | MR = 8% |

As seen from this result, we found that the magnetoresistance effect device 300 of the present invention has superior sensitivity to a magnetic field as compared with the conventional device when the device is formed so as to have a small size.

Example 6

The magnetic heads 500 having a structure shown in FIG. 5 were produced by using, as the magnetoresistance effect device 504, a GMR film of example sample 3 and a GMR film of conventional sample B, which were produced as in Example 3. The recording pole 507 and the shields 501 and 502 of the magnetic heads 500 were made of NiFe plated films. The track width of the GMR device 504 of the reproduction head section 505 was 0.3 µm, and the MR height was also 0.3 µm. For the purpose of examining the thermal stability of the produced heads 500, the heads 500 were stored in a thermostatic oven at 150° C., an electric current of 5 mA was applied to the heads 500 for 5 days, and output values of the heads 500 before and after such a heat test were compared. As a result, the output value of the head 500 produced with example sample 3 was decreased by about 1%, whereas the output value of the head produced with conventional sample B was decreased by about 33%. Thus, we found that the thermal stability of the head 500 according to the present invention was considerably improved as compared with that of the conventional head. By using the head 500 of the present invention, twenty magnetic recording/reproduction apparatuses 700 including a driver for the head 500, a magnetic recording medium disc, and a signal processing section were produced as shown in FIG. 7. The produced magnetic recording/reproduction apparatuses 700 were subjected to a heat test in a thermostatic oven at 130° C. We confirmed that none of the twenty apparatuses 700 were deteriorated.

Example 7

The magnetic heads 600 having a structure shown in FIG. 6 were produced by using, as the magnetoresistance effect device 504, TMR films of example samples 2 and 2A which were produced as in Example 2, a TMR film of example sample 4 which were produced in Example 4, and TMR films of conventional samples A and B. The shields 601 and 602 of the magnetic heads 600 were made of NiFe plated films. However, in Example 7, after the NiFe plated films of the shield 601 had been CMP-polished, the TMR film was formed with the inverse order to that described in Examples 2 and 4, i.e., the formation of the TMR film was begun with the NiFe film and ended with the PtMn film. Then, an electrode film was formed on the resultant structure. The TMR device of the reproduction head section was formed into a 0.5 µm×0.5 µm shape. For the purpose of examining the thermal stability of the produced heads 600, the heads 600 were stored in a thermostatic oven at 150° C., a voltage of 0.2 V was applied to the heads 600 for 5 days, and output values of the heads 600 before and after such a heat test were compared. As a result, the output values of the heads 600 produced with example samples 2, 2A, and 4 were decreased by about 4%, whereas the output values of the heads produced with conventional samples A and B were decreased by about 21%. Thus, we found that the thermal stability of the head 600 according to the present invention is considerably improved as compared with that of the conventional head.

Example 8

The magnetoresistance effect memory devices 800 shown in FIG. 8 were produced by using, as the magnetoresistance effect device 801, example sample 5 and conventional sample D which were produced in Example 5. In the first step, sense lines 802 were connected to both sides of example sample 5 and conventional sample D, and an AlO film was formed for insulation over each of the resultant structures. Then, a word line 804 of Cu was formed on the AlO film, and another AlO film was formed on the word line 804 for insulation. On the resultant structure, a word line 803 of Cu was formed, whereby the magnetoresistance effect memory devices 800 were produced as shown in FIG. 8. The produced memory devices 800 were arranged in a 64×64 matrix to obtain a trial product of a magnetic random access memory (MRAM). This trial product of the MRAM was processed by hydrogen sintering at 380° C., and in such a processed trial product, writing and reading operations were performed using the word lines 803 and 804. As a result, in the MRAM produced using example sample 5 of the present invention, a reproduction signal was identified, whereas in the MRAM produced using conventional sample D, a reproduction signal was not identified.

Example 9

The magnetoresistance effect memory devices 900 having a structure of FIG. 9 were produced by using, as the magnetoresistance effect device 901, example samples 4 and 4A and conventional sample C which were produced in Example 4. In each magnetoresistance effect memory device, the lower electrode for the device 901 was used as the word line/sense line 904, and the upper electrode for the device 901 was used as the sense line 902. On such a structure, an AlO film was formed for insulation, and the word line 903 of Cu was formed on the AlO film, whereby the magnetoresistance effect memory devices 900 having a structure shown in FIG. 9 were produced. The resistance of the produced memory devices 900 was about 10 kΩ. Electric currents were allowed to flow through the word lines 903 and 904 so as to generate a magnetic field. With this magnetic field, the magnetization direction of the free layer was inverted, thereby recording information "1". Thereafter, electric currents were allowed to flow through the word lines 903 and 904 in opposite directions so as to cause the magnetization direction of the free layer to be inverted, thereby recording information "2". In each of these two recording states, a bias voltage was applied between the sense lines 902 and 904 such that 0.05 mA of sense current flowed therebetween, whereby an output value of the device was measured for information "1" and for information "2". Both in the device produced with example sample 4 or 4A and the device produced with conventional sample C, a high output value of about 150 mV was obtained.

Next, the memory devices having such a structure were arranged in a 64×64 matrix to obtain a trial product of a magnetic random access memory (MRAM). In the first step, CMOSs, each of which works as a switching transistor (SW-Tr), were arranged in a matrix and flattened by CMP-polishing, and magnetoresistance effect memory devices having the above structure were arranged in a matrix so as to correspond to the CMOSs in a one-to-one manner. In the final step, the resultant structure was processed by hydrogen sintering at 380° C.

In a recording operation in a memory device at address (N,M) in the matrix, at first, electric currents were allowed to flow through word lines which cross above the memory device at address (N,M), and a synthetic magnetic field was generated by these currents. By the generated synthetic magnetic field, information was recorded in the memory device at address (N,M). In a reading operation, a desired memory device was selected by a corresponding CMOS switching transistor, and a resistance value of the selected device and a reference resistance value were compared, whereby information was read from each memory device. In these operations, in the MRAM produced with example sample 4 or 4A, a large output was obtained, as large as that obtained in a single memory device produced with example sample 4 or 4A. However, in the MRAM produced with conventional sample C, no output was obtained. This is assumed to be because the memory device of the present invention can endure hydrogen sintering processing at 380° C., but the conventional memory device cannot.

As described hereinabove, according to the present invention, a magnetoresistance effect device with improved thermal stability which stably operates even after a thermal treatment of 400° C., and a magnetic head, a magnetic recording medium and a memory device which are produced by using the thermally-stable magnetoresistance effect device of the present invention, can be produced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A magnetoresistance effect device, comprising:
    a free layer whose magnetization direction is easily rotated by an external magnetic field;
    a non-magnetization layer; and
    a pinned layer whose magnetization direction is not easily rotated by an external magnetic field, the pinned layer being provided on a face of the non-magnetization layer which is opposite to a face on which the free layer is formed,
    wherein the pinned layer includes:
        a first non-magnetic film for exchange-coupling; and
        first and second magnetic films which are antiferromagnetically exchange-coupled to each other via the first non-magnetic film, and
        the first non-magnetic film includes one of the oxides of Ru, Ir, Rh, and Re.

2. A magnetoresistance effect device according to claim 1, wherein the magnetoresistance effect device is a tunneling-type magnetoresistance effect device.

3. A magnetoresistance effect device according to claim 1, further comprising an antiferromagnetic film which is magnetically exchange-coupled to the pinned layer.

4. A magnetoresistance effect device according to claim 1, wherein:
    the free layer includes:
        a second non-magnetic layer for exchange-coupling, and
        third and fourth magnetic films which are antiferromagnetically exchange-coupled to each other via the second non-magnetic film;
    the second non-magnetic film for exchange-coupling includes one of the oxides of Ru, Ir, Rh, and Re; and
    the third magnetic film has an intensity of magnetization M1 and a thickness t1 and the fourth magnetic film has an intensity of magnetization M2 and a thickness t2, and a product (M1×t1) is substantially different from a product (M2×t2).

5. A magnetoresistance effect device according to claim 4, wherein at least one of the first through fourth magnetic films mainly contains cobalt (Co) and also contains boron (B).

6. A magnetoresistance effect device according to claim 1, wherein at least one of the first and second magnetic films mainly contains cobalt (Co) and also contains boron (B).

7. A magnetoresistance effect device according to claim 1, further comprising:
    an antiferromagnetic layer which is magnetically exchange-coupled to the pinned layer; and
    an underlying layer mainly containing NiFeCr, the underlying layer being provided on a face of the antiferromagnetic layer which is opposite to a face on which the pinned layer is formed.

8. A magnetic head for detecting a signal magnetic field from a recording medium, comprising:
    two shield sections each including a magnetic substance; and
    the magnetoresistance effect device of claim 1 provided in a gap between the two shield sections.

9. A magnetic recording medium, comprising:
    the magnetic head of claim 8 for recording a signal in a recording medium;
    an arm on which the magnetic head is mounted;
    a driving section for driving the arm; and
    a signal processing section for processing the signal and supplying the processed signal to the magnetic head.

10. A magnetic head, comprising:
    a magnetic flux guiding section including a magnetic substance; and
    the magnetoresistance effect device of claim 1 for detecting a signal magnetic field introduced by the magnetic flux guiding section.

11. A magnetic recording medium, comprising:
    the magnetic head of claim 10 for recording a signal in a recording medium;
    an arm on which the magnetic head is mounted;
    a driving section for driving the arm; and
    a signal processing section for processing the signal and supplying the processed signal to the magnetic head.

12. A magnetoresistance effect device, comprising:
    a free layer whose magnetization direction is easily rotated by an external magnetic field;
    a non-magnetization layer; and
    a pinned layer whose magnetization direction is not easily rotated by an external magnetic field, the pinned layer being provided on a face of the non-magnetization layer which is opposite to a face on which the free layer is formed,
    wherein the free layer includes:
        a first non-magnetic layer for exchange-coupling; and
        first and second magnetic films which are antiferromagnetically exchange-coupled to each other via the first non-magnetic film,
    the first non-magnetic film includes one of the oxides of Ru, Ir, Rh, and Re, and
    the first magnetic film has an intensity of magnetization M1 and a thickness t1 and the second magnetic film has an intensity of magnetization M2 and a thickness t2, and a product (M1×t1) is substantially different from a product (M2×t2).

13. A magnetoresistance effect device according to claim 12, wherein the magnetoresistance effect device is a tunneling-type magnetoresistance effect device.

14. A magnetoresistance effect device according to claim 12, further comprising:
    an antiferromagnetic layer which is magnetically exchange-coupled to the pinned layer; and
    an underlying layer mainly containing NiFeCr, the underlying layer being provided on a face of the antiferromagnetic layer which is opposite to a face on which the pinned layer is formed.

15. A magnetic head for detecting a signal magnetic field from a recording medium, comprising:
    two shield sections each including a magnetic substance; and
    the magnetoresistance effect device of claim 12 provided in a gap between the two shield sections.

16. A magnetic recording medium, comprising:
    the magnetic head of claim 15 for recording a signal in a recording medium;
    an arm on which the magnetic head is mounted;
    a driving section for driving the arm; and
    a signal processing section for processing the signal and supplying the processed signal to the magnetic head.

17. A magnetic head, comprising:
    a magnetic flux guiding section including a magnetic substance; and
    the magnetoresistance effect device of claim 12 for detecting a signal magnetic field introduced by the magnetic flux guiding section.

18. A magnetic recording medium, comprising:
    the magnetic head of claim 17 for recording a signal in a recording medium;
    an arm on which the magnetic head is mounted;
    a driving section for driving the arm; and
    a signal processing section for processing the signal and supplying the processed signal to the magnetic head.

19. A magnetoresistance effect memory device, comprising:
    a magnetoresistance effect device including:
        a free layer whose magnetization direction is easily rotated by an external magnetic field,
        a non-magnetization layer, and
        a pinned layer whose magnetization direction is not easily rotated by an external magnetic field, the pinned layer being provided on a face of the non-magnetization layer which is opposite to a face on which the free layer is formed,
        wherein the pinned layer includes:
            a non-magnetic film for exchange-coupling; and
            first and second magnetic films which are antiferromagnetically exchange-coupled to each other via the non-magnetic film,
            the non-magnetic film for exchange-coupling includes one of the oxides of Ru, Ir, Rh, and Re;
    a word line for generating a magnetic field so as to invert the magnetization direction of the free layer; and
    a sense line for detecting a change in resistance of the magnetoresistance effect device.

20. A magnetoresistance effect memory device according to claim 19, wherein the magnetoresistance effect device further includes an antiferromagnetic film which is magnetically exchange-coupled to the pinned layer.

21. A magnetoresistance effect memory device according to claim 19, wherein the free layer includes:
    a second non-magnetic layer for exchange-coupling; and
    third and fourth magnetic films which are antiferromagnetically exchange-coupled to each other via the second non-magnetic film;
    the second non-magnetic film for exchange-coupling includes one of the oxides of Ru, Ir, Rh, and Re; and
    the third magnetic film has an intensity of magnetization M1 and a thickness t1 and the fourth magnetic film has an intensity of magnetization M2 and a thickness t2, and a product (M1×t1) is substantially different from a product (M2×t2).

22. A magnetoresistance effect memory device according to claim 21, wherein at least one of the first through fourth magnetic films mainly contains cobalt (Co) and also contains boron (B).

23. A magnetoresistance effect memory device according to claim 19, wherein at least one of the first and second magnetic films mainly contains cobalt (Co) and also contains boron (B).

24. A magnetoresistance effect memory device according to claim 19, wherein the magnetoresistance effect device further includes:
    an antiferromagnetic layer which is magnetically exchange-coupled to the pinned layer; and
    an underlying layer mainly containing NiFeCr, the underlying layer being provided on a face of the antiferromagnetic layer which is opposite to a face on which the pinned layer is formed.

25. A memory device which is formed by the magnetoresistance effect devices of claim 19 arranged in a matrix.

26. A memory device according to claim 25, wherein each of the magnetoresistance effect devices further includes:
    an antiferromagnetic layer which is magnetically exchange-coupled to the pinned layer; and
    an underlying layer mainly containing NiFeCr, the underlying layer being provided on a face of the antiferromagnetic layer which is opposite to a face on which the pinned layer is formed.

27. A magnetoresistance effect memory device, comprising:
    a magnetoresistance effect device including:
        a free layer whose magnetization direction is easily rotated by an external magnetic field,
        a non-magnetization layer, and
        a pinned layer whose magnetization direction is not easily rotated by an external magnetic field, the pinned layer being provided on a face of the non-magnetization layer which is opposite to a face on which the free layer is formed,
        wherein the free layer includes:
            a first non-magnetic layer for exchange-coupling; and
            first and second magnetic films which are antiferromagnetically exchange-coupled to each other via the first non-magnetic film,
            the first non-magnetic film includes one of the oxides of Ru, Ir, Rh, and Re, and
            the first magnetic film has an intensity of magnetization M1 and a thickness t1 and the second magnetic film has an intensity of magnetization M2 and a thickness t2, and a product (M1×t1) is substantially different from a product (M2×t2);
    a word line for generating a magnetic field so as to invert the magnetization direction of the free layer; and
    a sense line for detecting a change in resistance of the magnetoresistance effect device.

28. A magnetoresistance effect memory device according to claim 27, wherein the magnetoresistance effect device further includes:
    an antiferromagnetic layer which is magnetically exchange-coupled to the pinned layer; and
    an underlying layer mainly containing NiFeCr, the underlying layer being provided on a face of the antiferromagnetic layer which is opposite to a face on which the pinned layer is formed.

* * * * *